United States Patent [19]
Barber

[11] Patent Number: 5,808,516
[45] Date of Patent: Sep. 15, 1998

[54] LINEARIZATION OF VOLTAGE-CONTROLLED AMPLIFIER USING MOSFET GAIN CONTROL CIRCUIT

[75] Inventor: Andrew C. Barber, Venice, Calif.

[73] Assignee: Harris Corporation, Melbourne, Fla.

[21] Appl. No.: 669,792

[22] Filed: Jun. 28, 1996

[51] Int. Cl.[6] ....................................................... H03G 3/30
[52] U.S. Cl. ............................................. 330/282; 330/284
[58] Field of Search .................................... 330/278, 279, 330/282, 284, 285, 86

[56] References Cited

U.S. PATENT DOCUMENTS

| | | | |
|---|---|---|---|
| 3,581,223 | 5/1971 | Armstrong | 330/282 X |
| 3,631,262 | 12/1971 | Jarrett | 330/282 X |
| 4,178,482 | 12/1979 | Ovellette | 330/284 X |

FOREIGN PATENT DOCUMENTS

| | | | |
|---|---|---|---|
| 0140100 | 2/1980 | Germany | 330/284 |
| 0020641 | 2/1979 | Japan | 330/284 |

OTHER PUBLICATIONS

Graeme, Jerald, "Feedback Lowers Age Distortion", EDN, Jan. 7, 1981, p. 202.

*Primary Examiner*—Steven Mottola
*Attorney, Agent, or Firm*—Charles E. Wands

[57] ABSTRACT

A linearized voltage controlled amplifier (VCA) circuit uses the resistance of a gain control MOSFET to control amplifier gain in accordance with a DC gain control voltage. A gain control voltage is applied to the gain control MOSFET's gate through a gate input resistor that forms a voltage divider with a feedback resistor from the output of the amplifier. Since the VCA's output terminal is a low impedance node, the voltage divider network applies most of the gain control voltage to the gate of the gain control MOSFET. Conversely, a small fraction of the amplifier output signal is coupled to the gain control MOSFET's gate, to reduce distortion. The linearized VCA circuit is augmented by a gate drive correction circuit, through which the gain control voltage is coupled to the VCA's gain control MOSFET. The gate drive correction circuit is comprised of a difference amplifier and a compensating MOSFET that is matched with the gain control MOSFET of the VCA circuit for controlling its gate drive voltage.

17 Claims, 2 Drawing Sheets

LINEARIZATION OF VOLTAGE-CONTROLLED AMPLIFIER USING MOSFET GAIN CONTROL CIRCUIT

FIELD OF THE INVENTION

The present invention relates in general to signal processing circuits, such as those employed in communication modem devices, and is particularly directed to a new and improved circuit arrangement for linearizing the operation of voltage-controlled amplifier (VCA), by feeding back the output of the amplifier as a gate drive input to a gain-controlling, field effect transistor (e.g., MOSFET)-implemented input resistor.

BACKGROUND OF THE INVENTION

FIGS. 1 and 2 diagrammatically illustrate non-limiting examples of conventional voltage controlled amplifier circuits, which employ field effect transistors, such as MOSFETs, as variable resistance devices for controlling amplifier gain in accordance with a control voltage that is applied to the gate of the MOSFET. In each of the illustrated circuit configurations, a gain control MOSFET 10 operates as a voltage-controlled, variable resistance, having its drain 12-to-source 14 current flow path coupled between a first (+) input terminal 21 of an operational amplifier 20 and ground. The signal to be amplified is coupled to an input terminal 11 through an input resistor 31 to the first input terminal 21 of the operational amplifier 20. The fundamental gain of the amplifier is established in accordance with the ratio of a feedback resistor 33, which is coupled between the amplifier output terminal 23 and a second (−) input terminal 22, and an input resistor 35, which is coupled between (−) input terminal 22 and ground. In order to vary or adjust the gain of the amplifier relative to this preestablished gain function, a gain control voltage is applied to a control terminal 15, to which the MOSFET gate 16 is coupled, so as to vary the resistance of the MOSFET 10 and thereby the overall gain of the amplifier 20.

Because MOSFETs are inherently non-linear devices, and their voltage—current transfer functions vary with temperature, as well as from device to device (as a result of different manufacturing conditions among different lots), in the voltage controlled amplifier configuration of FIG. 1, MOSFET 10 introduces non-linearity in the amplifier gain with the control voltage that is applied via a gain control terminal 15 to the control gate 16 of MOSFET 10. Also, since MOSFET resistance is non-linear, it introduces signal path distortion (undesired alteration of the signal).

FIG. 2 diagrammatically illustrates one conventional proposal to compensate for this unwanted MOSFET-induced distortion by providing a feedback path via a resistor 41 and a capacitor 43 that are connected in series from the drain 12 to the gate 16 of the MOSFET 10. The input signal is coupled to the MOSFET gate 16 through a gate input resistor 45, the value of which corresponds to that of the feedback resistor 41. The purpose of the drain-to-gate feedback RC circuit of FIG. 2 is to feed a substantial portion of the MOSFET's drain voltage back to the gate and thereby reduce the MOSFET-induced distortion.

A problem with the drain to gate feedback scheme of FIG. 2 is the fact that a portion of the gain control voltage applied to control input 15 (and thereby to the gate 16 of MOSFET 10) is also fed forward or coupled into the input signal to be amplified that is supplied via input resistor 31 to the (−) input 21 of the amplifier. This lack of feedforward isolation from the MOSFET gate 16 to its drain 12 means that at very low input signal levels, which may be on the order of only several hundred microvolts, the gain control voltage may dominate the amplifier input signal.

A second effect occurs if the gain control input happens to have a substantial high frequency component (such as would be the case with a step function), due to the fact that the RC feedback circuit forms a voltage divider network formed by resistors 41 and 45, so that initially only a portion (e.g., half) of the gain control voltage is applied to the MOSFET gate 16. Subsequently, the gate control voltage applied to control input 15 will charge up the capacitor 43, causing the control voltage to reach a steady state DC offset bias value, which is continuously applied to the input signal terminal 21, thereby interfering with the effect of the control voltage input and degrading performance of the amplifier. Thus, the RC network impairs rapidly and accurately setting the gain of the amplifier.

SUMMARY OF THE INVENTION

In accordance with the present invention, the desire to use a non-linear voltage controlled resistance element, such as a field effect transistor (JFET, MOSFET), as a variable resistance device for controlling the gain of a voltage-controlled amplifier in accordance with a DC gain control voltage, but without the inherent non-linearity, distortion and unwanted control voltage feedthrough described above, is successfully achieved by replacing the MOSFET's drain-to-gate RC feedback circuit with a feedback circuit comprised of a feedback resistor that is connected between the output of the amplifier to the control gate of the MOSFET. Because the feedback resistor provides a resistive-coupling of the output of the amplifier to the control gate of the MOSFET, a portion of the output of the amplifier is continuously fed back to the control gate of the MOSFET. As will be described, this provides a reduction in distortion of the operation of the voltage control amplifier. As in the conventional VCA of FIG. 1, a MOSFET-implemented, voltage-controlled resistance has its drain coupled directly to one input of the amplifier, and no circuit path directly coupled between its drain and gate. Since there is no such (feedforward) circuit path coupled from the gate to the drain of the voltage controlled MOSFET resistor, no appreciable component of any gain control voltage applied to the MOSFET's gate will be fed forward to an input of the amplifier.

Instead, the gain control voltage is applied to the gate of the MOSFET through a gate input resistor that forms a voltage divider with and having a value that is only a small fraction of that of the feedback resistor. Since the amplifier operates at high gain (e.g., a gain of ten), the voltage divider network applies most of the gain control voltage applied to the gate input resistor to the gate of the MOSFET 10. Conversely, a small fraction of the amplifier output signal is coupled through the feedback resistor to the MOSFET gate, so as to provide the intended reduction in distortion of the operation of the VCA. The low impedance at the VCA's output terminal also obviates the need for an AC-coupling capacitor in the feedback path to prevent DC leakage.

Because variation of resistance with gate voltage of the gain control MOSFET is non-linear, a gate drive correction circuit is installed in the gain control voltage input path. This gate drive correction circuit employs a MOSFET that is matched with the gain control MOSFET of the VCA, so as to compensate for variations in gate threshold voltage among different MOSFETs, differences in temperature coefficient, and the fact that the shape of the MOSFET's transfer function will vary with differing transconductances among different devices. The matched MOSFET is preferably obtained from a multiple MOSFET-containing integrated circuit, in which plural devices have effectively the same geometries and dopant parameters, so that their electronic behaviors are predictably the same.

The gate drive correction circuit's MOSFET operates as a variable resistance for one of the input terminals of a difference amplifier, having its drain-source current flow path coupled between a first input terminal of the difference amplifier and ground. The gain control voltage for the VCA circuit is applied through an input resistor to the first input terminal of the difference amplifier of the gate drive correction circuit. The difference amplifier's output terminal is coupled to the gate of the gain control MOSFET of the VCA circuit to provide a pre-corrected gain control voltage for the VCA.

A second input terminal of the difference amplifier receives a prescribed low valued DC voltage sufficient to provide operational bias to the gate drive correction circuit's MOSFET. The output terminal of the difference amplifier is further coupled through a feedback path resistor to the gate of the correction circuit's MOSFET, that gate also being coupled through a gate bias resistor to a source of reference potential (e.g., ground). The resistor in the feedback path from the output of the difference amplifier to the gate input resistor forms a resistor divider, whose parameters are complementary to those of the resistor divider network feeding the gate of the VCA's gain control MOSFET, by setting the value of the feedback resistor from the output of the difference amplifier to be the same small fraction of the resistance of the gate bias resistor, as is the small fraction of the feedback resistor in the VCA circuit to the gate input resistor to the gain control MOSFET. In particular, the ratio of the feedback resistance to the gate bias resistance for the correction circuit's MOSFET is inverse to the ratio of the feedback resistance to the gate input resistance for the VCA's gain control MOSFET, forming a voltage divider network complementary to that for the VCA's gain control MOSFET.

In operation, since the difference amplifier of the gate drive correction circuit maintains a voltage balance between its two input terminals, a gain control voltage applied to the difference amplifier's input resistor will establish a voltage drop across that input resistor that is equal to the difference between the applied gain control voltage and the reference voltage applied to the second input to the difference amplifier. This voltage drop causes an input current, that is proportional to the ratio of this voltage drop to the value of the input resistor, to flow through the input resistor to an first input of the difference amplifier. Since the difference amplifier's output is fed back to the gate terminal of the correction MOSFET, which has its drain-source current flow path coupled between the first input terminal of the difference amplifier and ground, the difference amplifier will drive the gate of the correction MOSFET, so that the MOSFET's drain-source path will sink all of the current flowing through the input resistor to ground, thereby making the effective resistance of the MOSFET linearly inversely proportional to the gain control voltage.

Because the output of the difference amplifier is connected in cascade to the gate of the VCA's gain control MOSFET, which is matched with the MOSFET of the compensation circuit, the resistance of the VCA's gain control MOSFET will now be linearly controlled in accordance with the gain control voltage applied to the gate correction circuit, thereby providing a VCA whose gain is inversely proportional to the gain control voltage.

DETAILED DESCRIPTION

Figure 1:
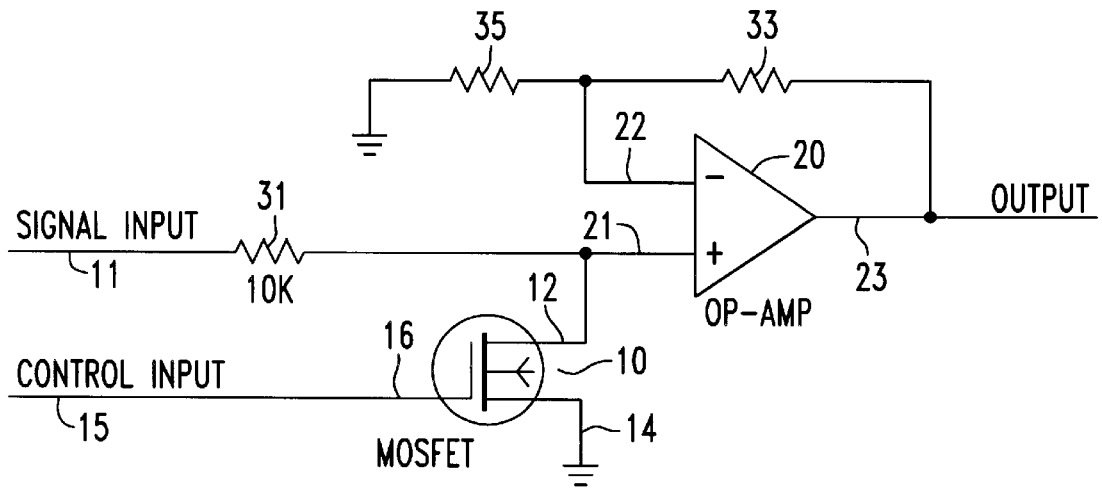
FIG. 1 diagrammatically illustrates a conventional voltage controlled amplifier circuit having a MOSFET as a variable resistance device for controlling amplifier gain.
Figure 2:
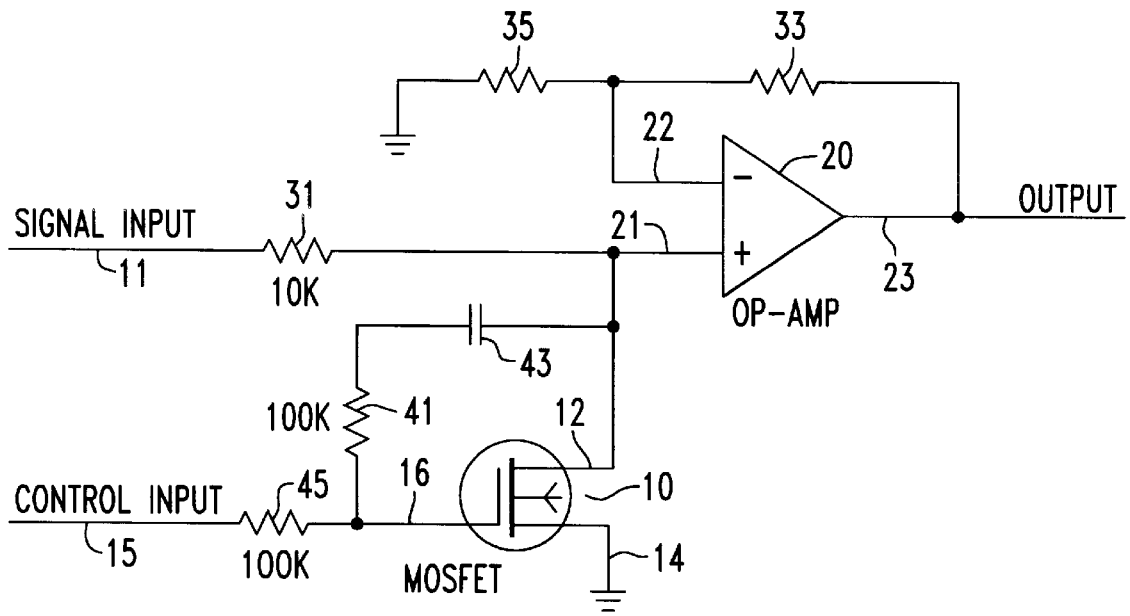
FIG. 2 diagrammatically illustrates a modification of the voltage controlled amplifier circuit of FIG. 1 having a drain-to-gate feedback RC circuit to its controlled MOSFET input resistance.

As described briefly above, the improved voltage controlled amplifier circuit in accordance with the present invention is configured to linearize the operation of a VCA circuit of the configuration shown in FIG. 1, without suffering from the control voltage feedforward problem of the drain-to-gate RC coupling circuit used of FIG. 2, by installing a linearization feedback path from the output of the VCA circuit, which is a low impedance node, to the control gate of the voltage controlled, variable resistance MOSFET.

Figure 3:
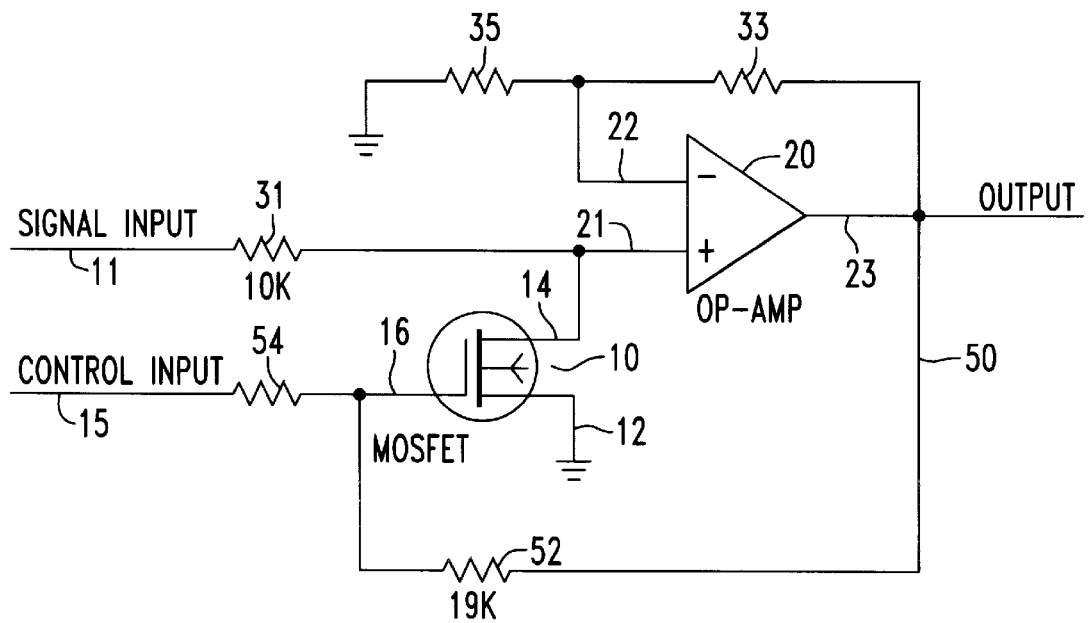
FIG. 3 diagrammatically illustrates an improved modification to the VCA amplifier configuration of FIGS. 1 and 2, in accordance with an embodiment of the invention, which a feedback resistor is coupled from the output of the VCA to the gate of a gain control MOSFET.

For this purpose, as diagrammatically illustrated in FIG. 3, the improved modification to the VCA amplifier configurations of FIGS. 1 and 2 is shown as comprising an amplifier output feedback path 50, which contains a feedback resistor 52 and is coupled from the low impedance output 23 of high gain (e.g., a gain of ten) operational amplifier 20 to the gate 16 of MOSFET 10. The feedback resistor 52 provides a resistive-coupling of the output of the amplifier 20 to the control gate 16 of the MOSFET 10. Consequently, a portion of the output of the amplifier is continuously fed back to the control gate 16 of the MOSFET 10, so that a small fraction of the amplifier output signal is coupled through the feedback resistor to the MOSFET gate, providing a reduction in distortion of the MOSFET. As in the embodiment of FIG. 1, the MOSFET-implemented voltage controlled resistance 10 has its drain 12 coupled directly to the (+) input 21 of the amplifier 20, but with no feedback (feedforward) path coupled between its drain 12 and gate 16, as in the embodiment of FIG. 2. Since there is no feedforward path from the gate to the drain of the MOSFET 10, the benefit of the extremely high isolation impedance (in excess of several hundred MΩ) between the gate and the drain of the MOSFET 10 is not compromised, thereby maintaining the control voltage applied to the control voltage input 15 highly attenuated (e.g., down a hundred dB or more) at the (+) input 21 of the amplifier 20. As described earlier, this isolation is particularly important at very low input signal levels, which may be on the order of microvolts, where the control voltage may be considerably higher (e.g., on the order of millivolts).

The gain control voltage applied to control input 15 is coupled to the MOSFET gate 16 through a gate input resistor 54 coupled to control input terminal 15. The value of gate input resistor 54 is only a small fraction of that of feedback resistor 52. As a non-limiting example, the value of feedback resistor 52 may be on the order of 19 KΩ, while that of gate input resistor 52 may be on the order of 1 KΩ. As a result, since the output terminal 23 of high gain amplifier 20 is a low impedance node, resistors 54 and 52 present a voltage divider network to whatever control voltage is coupled to input terminal 15. With the resistor values of the present example, most of the control voltage applied to control input terminal 15 (95% in the present example) is coupled to the gate 16 of MOSFET 10, as intended, while a relatively small fraction of the amplifier output signal is coupled through feedback path 50 to the MOSFET gate 16, so as to provide the intended reduction in distortion of the MOSFET. The low impedance at the high gain amplifier output terminal 23 also obviates the need for an AC-coupling capacitor in the feedback path 50, to prevent DC leakage.

Now even though FIG. 3 provides a substantially improved feedback control of the gate drive to the VCA's gain control MOSFET, the drain-to-source resistance of MOSFET 10 does not vary linearly with the magnitude of its gate voltage, which is intended to be a desired gain control voltage. Instead, at extremely low gate voltages (near or slightly above zero volts) MOSFET 10 is not conducting. As the voltage is increased, once a prescribed threshold voltage (e.g., on the order of one to two volts) is reached, the MOSFET begins to conduct current, and the resistance of the MOSFET decreases thereafter. Because of this non-linear behavior, the variation in MOSFET resistance with gate control voltage is not readily definable.

To compensate for this undesirable non-linear variation of resistance of the gain control MOSFET with gain control voltage, a gate drive correction circuit is installed in the gain control voltage input path to gain control input terminal 15 to which the gate 16 of gain control MOSFET 10 is connected. As will be described, the gate drive correction circuit of FIG. 4 employs a MOSFET that is matched with the gain control MOSFET of the VCA, so as to compensate for variations in gate threshold voltage among different MOSFETs, differences in temperature coefficient, and the fact that the shape of the MOSFET's transfer function will vary with differing transconductances among different devices. The matched MOSFET is preferably obtained from a multiple MOSFET-containing integrated circuit, in which plural devices have effectively the same geometries and dopant parameters, so that their electronic behaviors are predictably the same.

Figure 4:
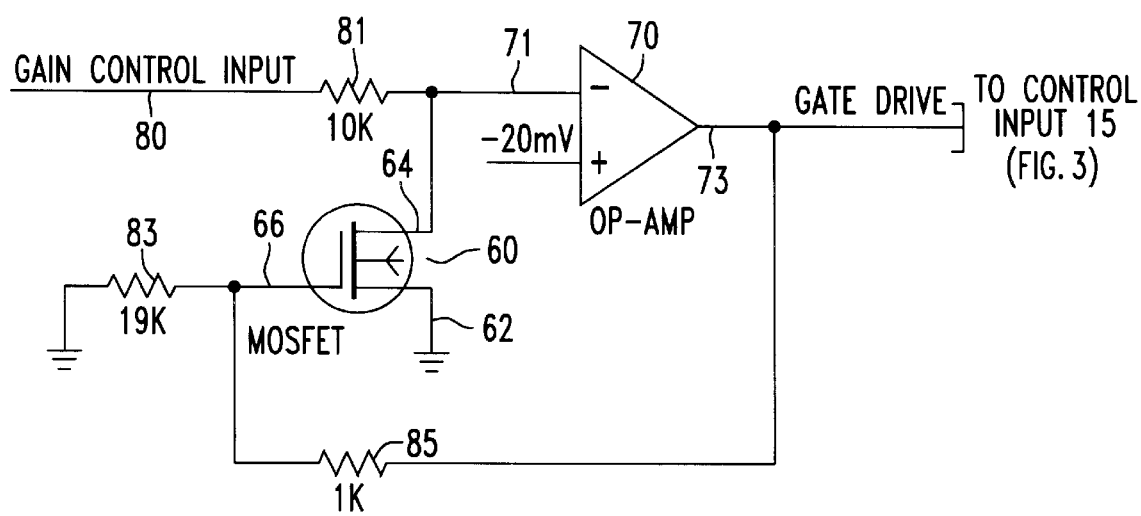
FIG. 4 diagrammatically illustrates a gate drive correction circuit for the gain control voltage input to gain control MOSFET employed in the VCA circuit of FIG. 3.

To this end, FIG. 4 diagrammatically illustrates a gate drive correction circuit for the gain control voltage input to the circuit of FIG. 3, that contains a MOSFET 60 that is matched with the MOSFET 10 of the VCA circuit of FIG. 3, and is used to control the gate drive voltage applied to the control voltage terminal 15 in the circuit of FIG. 3. The matched MOSFET 60 is preferably obtained from a multiple MOSFET-containing integrated circuit containing MOSFET 10, so that plural devices have effectively the same geometries and dopant parameters, thereby making their electronic behaviors predictably the same.

In the gate drive correction circuit of FIG. 4, MOSFET 60 is coupled in a feedback loop of an operational (difference) amplifier 70. Like MOSFET 10 in the circuit of FIG. 3, MOSFET 60 operates as a variable resistance for one of the input terminals of the difference amplifier 70, having its drain 62-to-source 64 current flow path coupled between a first (−) input terminal 71 of difference amplifier 70 and ground. An inverted polarity gain control voltage is applied to the VCA circuit of FIG. 3 via an input terminal 80. Input terminal 80 is coupled through an input resistor 81 to the first (−) input terminal 71 of the operational amplifier 70 of the gate drive correction circuit of FIG. 4.

The output terminal 73 of difference amplifier 70 is coupled to the control terminal 15 of FIG. 3, so that the (gain control) voltage for the MOSFET 10 of FIG. 3 will have been pre-corrected by the gate drive correction circuit of FIG. 4 prior to be applied to gain control terminal 15 of FIG. 3, as will be described. A second (+) input terminal 72 of difference amplifier 70 is coupled to receive a prescribed low valued DC voltage (e.g., 20 mv), sufficient to provide operational bias to the drain 64 of MOSFET 60, the source of which is grounded. The output terminal 73 of amplifier 70 is further coupled through a feedback resistor 85 to the gate 66 of MOSFET 60, with gate 66 being also coupled through a gate bias resistor 83 to a source of reference potential (e.g., ground).

The resistor 85 in the feedback path from the difference amplifier output terminal 73 to the gate input resistor 83 forms a resistor divider to the gate 66 of MOSFET 60. The values of resistor 85 and resistor 83 are selected to be complementary to those of resistors 52 and 54 of the resistor divider feeding the gate 16 of the VCA's gain control MOSFET 10, by setting the value of the feedback resistor 85 from the output terminal 73 of the difference amplifier 70 to be the same small fraction of the resistance of the gate bias resistor 83, as is the fraction of the value of the gate input resistor 54 to the gate 16 of gain control MOSFET 10 to the value of the feedback resistor 52. In other words, the ratio of the feedback resistance 85 to the gate bias resistance 83 for the correction circuit's MOSFET 60 is inverse to the ratio of the feedback resistance 52 to the gate input resistance 54 for the VCA's gain control MOSFET 10, forming a voltage divider network whose values are complementary to those for the VCA's gain control MOSFET 10. Thus, for the non-limiting parameters of FIG. 3, described above, the value of gate bias resistor 83 may be on the order of 19 KΩ, while that of feedback resistor 85 may be on the order of 1 KΩ. As a result, resistors 54 and 52 present a voltage divider network to whatever voltage is fed back from output terminal 73 to gate terminal 66, with most of the fed back voltage (95% in the present example) being coupled to the gate 66 of MOSFET 60.

In operation, since the difference amplifier 70 is operative to maintain a voltage balance between its two input terminals 71 and 72, a gain control voltage Vg applied at input 80 will establish a voltage drop across input resistor 81 that is equal to the difference between the applied gain control voltage and the reference voltage applied (20 mv) to the second input 72 to the difference amplifier. This voltage drop (Vg−20 mv) causes an input current, that is proportional to the ratio of this voltage drop to the value of the input resistor 81, to flow through the input resistor 81 to a first (−) input 71 of the difference amplifier 70. Since the voltage at the difference amplifier's output terminal 73 is fed back to the gate terminal 66 of the correction MOSFET 60 (which has its drain-source current flow path coupled between the first input terminal 71 of the difference amplifier 70 and ground), difference amplifier 70 will drive the gate 66 of the correction MOSFET 60, so that the MOSFET's drain-source path (64-62) will sink all of the current flowing through the input resistor 81, thereby making the effective resistance of the MOSFET 60 linearly inversely proportional to the gain control voltage. Because the output of the difference amplifier 70 is connected in cascade to the gate 16 of the VCA's gain control MOSFET 10, which is matched with the MOSFET 60 of the gate correction circuit, the resistance of the VCA's gain control MOSFET 10 will also linearly inversely proportional to the gain control voltage.

Since, as described above, the value of feedback resistor 85 is a predetermined small fraction of the resistance of gate bias resistor 83 and the ratio of the two is exactly inverse to the ratio of the feedback resistance 52 to the gate input resistance 54 for MOSFET 10 in the VCA of FIG. 3, the gate drive voltage to MOSFET 10 in the VCA circuit of FIG. 3 will be exactly the same as the gate drive for the MOSFET 60 in the gate drive correction circuit of FIG. 4. It can be seen therefore, that cascading the gate drive correction circuit of FIG. 3 with the VCA circuit of FIG. 4 provides a linearized VCA whose gain control resistance is predictably linearly inversely proportional to the gain control voltage.

As will be appreciated from the foregoing description, the desire to use a MOSFET as a variable resistance to control the gain of a voltage-controlled amplifier in accordance with a DC gain control voltage, but without non-linearity, distortion and control voltage feedthrough, is attained in accordance with the present invention by replacing the gain control MOSFET's drain-to-gate RC feedback circuit with a feedback resistor connected between the output of the amplifier to the control gate of the gain control MOSFET, so that no appreciable component of gain control voltage will be fed forward to the input of the amplifier. By pre-correcting the gain control voltage with a gate drive correction circuit comprised of a MOSFET that is matched with the MOSFET of the VCA circuit, both linear control of the VCA's MOSFET resistance with gain control voltage is achieved and variations in operational parameters among different MOSFETs are compensated.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A voltage controlled amplifier circuit comprising:
    an operational amplifier having an input terminal to which a signal to be amplified is coupled, and an output terminal from which an amplified signal is derived;
    a voltage-controlled, variable resistance device coupled between said input terminal and a reference terminal, and having a control terminal to which a gain control voltage is applied for controlling the resistance of said voltage controlled resistance; and
    a feedback circuit coupled between said output terminal of said operational amplifier and said control terminal of said voltage-controlled, variable resistance device and being operative to linearly control the resistance of said voltage controlled resistance in accordance with said gain control voltage by continuously feeding back a small fraction of said amplified output signal derived at said output terminal of said operational amplifier to said control terminal of said voltage-controlled, variable resistance device.

2. A voltage controlled amplifier circuit according to claim 1, further including a control terminal voltage correction circuit, which is operative to pre-adjust said gain control voltage applied to said control terminal of said voltage-controlled, variable resistance device, such the resistance of said voltage controlled resistance varies as a linear function of said gain control voltage.

3. A voltage controlled amplifier circuit according to claim 1, wherein said voltage-controlled, variable resistance device comprises a gain control field effect transistor having is drain-source path coupled between said input terminal and said reference terminal, and having a gate terminal coupled to receive said gain control voltage for controlling the resistance of said gain control field effect transistor.

4. A voltage controlled amplifier circuit according to claim 3, further including a gate voltage correction circuit which is operative to pre-adjust said gain control voltage prior to its being coupled to said gate terminal of said gain control field effect transistor, such the resistance of said gain control field effect transistor varies as a linear function of said gain control voltage.

5. A voltage controlled amplifier circuit according to claim 2, wherein said control terminal voltage correction circuit comprises:
    a difference amplifier having a first input terminal to which said gain control voltage is coupled, a second input to which a reference voltage is supplied, and an output terminal,
    a further voltage-controlled, variable resistance device coupled between said first input terminal and said reference terminal, and having a control terminal to which a bias voltage is applied; and
    a further feedback circuit coupled between the output terminal of said difference amplifier and the control terminal of said further voltage-controlled, variable resistance device.

6. A voltage controlled amplifier circuit according to claim 5, wherein said further voltage-controlled, variable resistance device comprises a field effect transistor having its drain-source path coupled between said first input terminal of said difference amplifier and said reference terminal, and having a gate terminal coupled to said further feedback circuit for controlling the resistance of said field effect transistor.

7. A voltage controlled amplifier circuit according to claim 4, wherein said gate voltage correction circuit comprises:
    a difference amplifier having a first input terminal to which said gain control voltage is coupled, a second input to which a reference voltage is supplied, and an output terminal,
    a further field effect transistor coupled between said first input terminal and said reference terminal, and having a gate terminal to which a bias voltage is applied; and
    a further feedback circuit coupled between the output terminal of said difference amplifier and the gate terminal of said further field effect transistor.

8. A voltage controlled amplifier circuit according to claim 7, wherein said feedback circuit includes a feedback resistor coupled between the output terminal of said operational amplifier and the gate terminal of said gain control field effect transistor, and wherein said gain control field effect transistor has its gate terminal coupled through a gate resistor to the output terminal of said difference amplifier of said gate voltage correction circuit, said gate resistor forming a gain control voltage divider with said feedback resistor, said further feedback circuit comprises a further feedback resistor and wherein said further field effect transistor has its gate terminal coupled to receive a bias voltage through a further gate input resistor that forms a further voltage divider with said further feedback resistor.

9. A voltage controlled amplifier circuit according to claim 8, wherein said gain control voltage divider is operative to apply a major portion of said gain control voltage and a minor portion of the voltage at the output terminal of said operational amplifier to the gate terminal of said gain control field effect transistor, and wherein said further voltage divider is operative to apply a major portion of the voltage at the output terminal of said difference amplifier to the gate terminal of said further field effect transistor.

10. A voltage controlled amplifier circuit according to claim 9, wherein the ratio of said further feedback resistor to said further gate resistor for said further field effect transistor is inverse to the ratio of the feedback resistor to said gate resistor for said gain control field effect transistor.

11. A voltage controlled amplifier circuit comprising:

an operational amplifier having an input terminal to which a signal to be amplified is coupled, and an output terminal from which an amplified signal is derived;

a voltage-controlled, variable resistance, gain control MOSFET having its drain-to-source current flow path coupled between said input terminal and a reference potential terminal, and having its gate coupled to receive a gain control voltage for controlling the resistance of said gain control MOSFET, and thereby the gain of said voltage controlled amplifier; and a feedback circuit coupled between said output terminal of said operational amplifier and said gate of said gain control MOSFET, and being operative to linearly control the resistance of said gain control MOSFET in accordance with said gain control voltage by continuously feeding back a small fraction of said amplified signal derived at said output terminal of said operational amplifier to said gate of said gain control MOSFET.

12. A voltage controlled amplifier circuit according to claim 11, further including a gain control voltage correction circuit which is operative to pre-adjust the gain control voltage applied to said gate of said gain control MOSFET, such the resistance of said gain control MOSFET varies as a linear function of said gain control voltage.

13. A voltage controlled amplifier circuit according to claim 12, wherein said feedback circuit includes a feedback resistor coupled between the output terminal of said operational amplifier and the gate terminal of said gain control MOSFET, and wherein said gain control MOSFET has its gate terminal coupled to through a gate resistor to the output terminal of said difference amplifier of said gate voltage correction circuit, said gate resistor forming a gain control voltage divider with said feedback resistor.

14. A voltage controlled amplifier circuit according to claim 13, wherein said gain control voltage correction circuit comprises:

a difference amplifier having a first input terminal to which said gain control voltage is coupled, a second input to which a reference voltage is supplied, and an output terminal, a further MOSFET coupled between said first input terminal and said reference terminal, and having a gate terminal which is coupled to receive a bias voltage coupled thereto through a further gate resistor; and a further feedback circuit coupled between the output terminal of said difference amplifier and the gate terminal of said further MOSFET.

15. A voltage controlled amplifier circuit according to claim 14, wherein said further feedback circuit includes a further feedback resistor coupled between the output terminal of said difference amplifier and the gate terminal of said further MOSFET, said further gate resistor forming a further voltage divider with said further feedback resistor.

16. A voltage controlled amplifier circuit according to claim 15, wherein said further voltage divider is operative to apply a major portion of the voltage at the output terminal of said difference amplifier to the gate terminal of said further MOSFET, and wherein said gain control voltage divider is operative to apply a minor portion of the voltage at the output terminal of said difference amplifier to the gate terminal of said gain control MOSFET.

17. A voltage controlled amplifier circuit according to claim 16, wherein the ratio of said further feedback resistor to said further gate resistor for said further MOSFET is inverse to the ratio of the feedback resistor to said gate resistor for said gain control MOSFET.

* * * * *